United States Patent
Maeda et al.

(10) Patent No.: US 9,148,089 B2
(45) Date of Patent: Sep. 29, 2015

(54) TRANSMITTING APPARATUS AND TRANSMISSION METHOD

(71) Applicant: Panasonic Corporation, Osaka (JP)

(72) Inventors: Masakatsu Maeda, Osaka (JP); Masahiro Kumagawa, Hyogo (JP); Hisashi Adachi, Osaka (JP); Akinori Daimo, Hyogo (JP); Kenichi Mori, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/542,662

(22) Filed: Nov. 17, 2014

(65) Prior Publication Data

US 2015/0180418 A1 Jun. 25, 2015

(30) Foreign Application Priority Data

Dec. 25, 2013 (JP) ................................. 2013-267836
Oct. 22, 2014 (JP) ................................. 2014-215156

(51) Int. Cl.
*H03F 1/02* (2006.01)
*H03F 3/24* (2006.01)
*H03F 3/193* (2006.01)
*H04L 25/03* (2006.01)

(52) U.S. Cl.
CPC .............. *H03F 1/0205* (2013.01); *H03F 3/193* (2013.01); *H03F 3/245* (2013.01); *H04L 25/03* (2013.01); *H03F 2200/336* (2013.01); *H03F 2200/451* (2013.01)

(58) Field of Classification Search
USPC .................................................. 375/219, 302
See application file for complete search history.

(56) References Cited

U.S. PATENT DOCUMENTS

| | | | |
|---|---|---|---|
| 7,750,749 | B2 | 7/2010 | Jones |
| 8,013,771 | B2 | 9/2011 | Booth et al. |
| 8,705,657 | B2 * | 4/2014 | Lai et al. ........................ 375/302 |
| 2006/0267684 | A1 * | 11/2006 | Ohnishi et al. .................. 330/51 |
| 2012/0229308 | A1 * | 9/2012 | Tsai ................................. 341/22 |
| 2014/0125410 | A1 * | 5/2014 | Pamarti et al. ................. 330/149 |
| 2014/0176217 | A1 * | 6/2014 | Lin et al. ........................ 327/298 |
| 2015/0046492 | A1 * | 2/2015 | Balachandran ............... 707/772 |

OTHER PUBLICATIONS

Sang-Min Yoo, et al. "A Switched-Capacitor RF Power Amplifier" IEEE Journal of Solid-State Circuits, vol. 46, No. 12, Dec. 2011, pp. 2977-2987.
Poojan Wagh, et al. "High-Efficiency Switched-Mode RF Power Amplifier" 1999 IEEE, pp. 1044-1047.
(Continued)

*Primary Examiner* — Eva Puente
(74) *Attorney, Agent, or Firm* — Seed IP Law Group PLLC

(57) ABSTRACT

A transmitting apparatus and transmission method are capable of easily and correctly mixing an in-phase component and a quadrature-phase component in a quadrature modulator. A local signal with a duty ratio of 25% or smaller is generated without using frequency which is a multiple of frequency of the local signal. Without providing switches in series to the outputs of I and Q amplifiers, a duty ratio of 25% or less is obtained. for the local signal, and class-D unit amplifiers are operated such that one of the I amplifier and the Q amplifier is connected to the output side in any state regardless of whether an output power control signal is at an on-level or an off-level. In producing the 25% duty ratio, a local signal with a 50% duty ratio is converted so as to have a duty ratio of 25% by I and Q duty converters.

8 Claims, 10 Drawing Sheets

(56) References Cited

OTHER PUBLICATIONS

Xin He, et al. "A 45nm low-power SAW-less WCDMA transmit modulator using direct quadrature voltage modulation" IEEE International Solid-State Circuits Conference(ISSCC), 2009.

Nakajima et al. "L-band SiGe-MMIC Vector Synthesis Type Analog Phase Shifter using Polyphase Filter" Technical Report of IEICE, pp. 23-26.

Ahmad Mirzaei, et al. "Analysis of Direct-Conversion IQ Transmitters With 25% Duty-Cycle Passive Mixers" IEEE Transactions on Circuits and Systems, vol. 58, No. 10, Oct. 2011.

* cited by examiner ular frequency is a multiple of the frequency of the
TRANSMITTING APPARATUS AND TRANSMISSION METHOD

BACKGROUND

1. Technical Field

The present disclosure relates to a transmitting apparatus and a transmission method for reducing power consumption.

2. Description of the Related Art

To reduce power consumption of a transmitter used in wireless communication, it is generally effective to reduce power consumption of a power amplifier which consumes high power. A class-D amplifier is known as an example of a power amplifier capable of operating with low power consumption. The class-D amplifier is equivalent to a circuit configuration in which one of two switches is disposed between the power supply and the output and she other one is disposed between the ground and the output, and these two switches are alternately turned on such that the power supply voltage and the ground voltage are alternately output. In an ideal operation state, no shoot-through current flows between the power supply and the ground, and thus a high power efficiency is achieved.

However, in practical circuits, rounding of a signal or a timing error may cause the two switches to turn on simultaneously in this situation, a current can flow between the power supply and the ground, which results in a reduction in power efficiency. To handle the shoot-through current, it is known to use a non-overlapping clock technique.

In the non-overlapping clock technique, when the switch disposed between the power supply and the output and the switch disposed between the ground and the output are alternately turned on, a time period (non-overlapping period) is intentionally provided such that the both switches are in the off-state during this time period thereby preventing an occurrence of a shoot-through current that can cause a reduction in the power efficiency. This technique is very effective to increase the efficiency of the class-D amplifier, and thus this technique is widely used.

Next, a method of controlling output power of the class-D amplifier is described below briefly. As described above, the output of the class-C amplifier is ideally connected to a power supply or ground via a switch, such that the output voltage amplitude swings between the power supply and the ground. This makes it possible to control the output voltage by varying the power supply voltage. To vary the power supply voltage, a low-noise and high-response voltage regulator is necessary. However, a power loss occurs in the voltage regulator, and thus use of the voltage regulator results in an increase in power consumption.

In practice, the class-C amplifier is realized using a complementary metal-oxide semiconductor (CMOS) structure. However, the switches in this structure are not ideal but have a finite on-resistance. By changing the sizes of transistors in the CMOS structure, it is possible to change the on-resistance of the switches thereby controlling the output voltage. However, to achieve a sufficiently large variable output power range, it is necessary to vary the on-resistance over a large range from an extremely low value to a great value.

In addition to the technique described above, it also known to use a pulse-width modulation technique. In this technique, the duty ratio of the on-state is varied depending on the output power. Note that the duty ratio is defined by the ratio of an on-period relative to one period of a signal with a constant frequency. In the pulse-width modulation technique, there is a lower limit beyond which a further reduction in the duty ratio is difficult. This makes it difficult to reduce the output, power to a sufficiently low value, and thus it is difficult to achieve a sufficiently wide variable output power range (see, for example, 1999 IEEE High-Efficiency Switched-Mode RF Power Amplifier).

One of known techniques to handle the above situation associated with the controlling of output power is a switched capacitor power amplifier (hereinafter referred to as a SCPA) (see, for example, A Switched-Capacitor RF Power Amplifier, IEEE JOURNAL OF SOLID-STATE CIRCUITS, VOL. 46, NO. 12, DECEMBER, 2011). In the SCPA, the above-described problem with the controlling of output power is solved while maintaining the high efficiency property of the class-D amplifier.

For example, as in the amplifier 803 illustrated in FIG. 1, an equivalent circuit of the SCPA includes a plurality of class-D unit amplifiers that are connected in parallel such that the AND output thereof is obtained via a services capacitor. Among class-L) unit amplifiers connected in parallel, as many class-D unit amplifiers as proportional to the output power control signal are turned on, and the AND output of the other class-D unit amplifiers is grounded. In this configuration, the output signal of each D-class unit amplifier in the on-state is transferred to the output side via the corresponding series capacitor, and the output signal of each D-class unit amplifier in the off-state (the AND output of which is grounded) is transferred to the ground via the corresponding series capacitor. That is, the amplitude of the output signal from each D-class unit amplifier in the on-state is transferred to the output side via a capacitive attenuator, and the output power is determined by a capacitance ratio.

In a case where the SCPA is implemented in a semiconductor LSI or the like, it is possible to achieve high relative accuracy among elements in the semiconductor LSI or the like. Therefore, by implementing the SCPA of the above-describe type in a semiconductor LSI or the like, it is possible to achieve very high linearity and a wide variable output power range. Another feature of the SCPA is that when the amplifier 803 is seen from the node Cout 313, which is the output node of the amplifier 803 in FIG. 1, the impedance thereof is constant regardless of the level of the output power control signal. This is because the series capacitor of the AND output is always connected to the ground or the power supply, which can be regarded as being at the ground level for AC signals, regardless of whether the D-class unit amplifier is in the on-state or off-state. As a result, a combination of the series capacitor and an inductor 310 has a constant LC resonance frequency regardless of the output power control signal, which ensures that it is possible to extract a fundamental harmonic component from a signal output from the amplifier 803. Therefore, it is possible to achieve small leakage power to adjacent channels due to an impedance fluctuation, which can occur in the class-A amplifier.

In a transmitting apparatus formed using a plurality of switching circuits such as conventional class-D amplifiers, it is known to use frequency equal to a multiple of the frequency of the local signal in addition to the local signal serving as a carrier wave (see, for example, U.S. Pat. No. 7,750,749).

FIG. 2 is a diagram illustrating a configuration of a transmitting apparatus described in U.S. Pat. No. 7,750,749. In FIG. 2, reference numerals 90, 92, 96, and 98 denote transistors that turn on/off according to local signals input to gates thereof. Reference numerals 90 and 100 denote transistors that turn an/off according to the frequency of signals input to gates thereof wherein the frequency is a multiple of that of the local signal. At voltage transition of signals LOi and LOiB, a signal Vosc is off, while a signal VoscB is off at voltage transition of signals LOq and LOqB. By performing the control in this manner, the effective duty ratio of the local becomes 25%, and the phase of the output signal is determined by the signals Vosc and VoscB, which allows it to achieve low phase noise.

In general, a balun is used to mix I and Q signal components. However, when the balun is formed on an integral circuit, the resultant integral circuit has a large size, which besides results in an increase, in cost. Furthermore, another demerit, thereof is a large power loss in the technique disclosed in "A 45 nm Low-Power SAW-less WCDMA Transmit Modulator Using Direct Quadrature Voltage Modulation", 2009 ISSCC, like the technique disclosed in U.S. Pat. No. 7,750,749, a signal LO with a duty ratio of 25% is generated using frequency equal to a multiple of the frequency of the local signal (see FIG. 3). Use of the duty ratio of about 25% makes it possible to connect one of switches M1 to M4 to the output side in any state. As a result, it is possible to achieve isolation between I and Q mixers, which makes it possible to directly connect the outputs of I and Q mixers without using a balun such that no interference occurs and good orthogonality is maintained.

As for the quadrature modulator configured to perform IQ mixing without using a balun using the technique disclosed in "A 45 nm Low-Power SAW-less WCDMA Transmit Modulator Using Direct Quadrature Voltage Modulation", 2009 ISSCC, numerical formula analysis is performed in "Analysis of Direct Conversion IQ Transmitters With 25% Duty Cycle Passive Mixers", 2011 IEEE TRANSACTIONS ON CIRCUITS AND SYSTEMS. In this analysis, a mathematical expression shows that a spectrum appears at all, odd order harmonic components of the local signal which is the carrier wave. In the SCPA described above, these odd order harmonic components are removed, using an LC filter formed by the series capacitor connected to the AND output and an inductor 310. As described above, the LC resonance frequency is constant regardless of the output power control signal, and thus it is ensured that it is possible to remove the unnecessary odd order harmonic components other than the fundamental harmonic component.

In the SCPA (disclosed in "A Switched-Capacitor RF Power Amplifier", 2011 IEEE JOURNAL OF SOLID-STATE CIRCUITS, VOL. 46, NO. 12, DECEMBER), a quadrature modulator is formed using two amplifiers 803 in FIG. 1 for an in-phase (I) component and a quadrature-phase (Q) component, respectively, and, as with the quadrature modulator in FIG. 3 according to the technique disclosed in "A 45 nm Low-Power SAW-less WCDMA Transmit Modulator Using Direct Quadrature Voltage Modulation", 2009 ISSCC, a switch is added in series to the output of each amplifier 803 such that one of I and Q is connected to the output side. In this case, as for a transistor used as the switch to pass the output, power of the SOPA which is a power amplifier, the transistor needs to have a high breakdown voltage and a very low on-resistance. As a result, a very large transistor size is required. However, the large transistor has large parasitic capacitance. As described above, the class-D amplifier is realized using the CMOS structure including P-channel (Pch) and N-channel (Nch) elements such that he output voltage is alternately connected to the power supply and the ground via switches realized by the Pch and Nch elements. Therefore, the large parasitic capacitance causes an occurrence of a charging/discharging current to/from the parasitic capacitance, which results in a reduction in power efficiency of the SCPA. Furthermore, the parasitic capacitance causes the output signal to be rounded and thus distorted.

Note that the SCPA is formed using a plurality of class-D unit amplifiers illustrated in FIG. 4 connected in parallel. As many class-D unit amplifiers as proportional to the output power control signal are turned on (signal BB Data 326=H) and the output voltage thereof is alternately connected to the power supply and the ground via switches. On the other hand, the other class-D unit amplifiers are turned off (signal HF Data 326=L), and the AND output thereof is always grounded unless there is a change in the output power control signal.

However, in the case where the quadrature modulator is formed using two amplifiers 803 in FIG. 1 for the in-phase component and the quadrature-phase component, respectively, the AND output of the amplifier turned off by the output power control signal (signal BB Data 326=L) is always at the ground level even when the local signal with the duty ratio of 25% is used as described in the "A 45 nm Low-Power SAW-less WCDMA Transmit Modulator Using Direct Quadrature Voltage Modulation", 2009 ISSCC illustrated in FIG. 3. Therefore, when the amplifiers 803 for the in-phase component and the quadrature-phase component are directly connected, the in-phase component and the quadrature-phase component interfere with each other, and thus the orthogonally, which should be achieved, is lost.

SUMMARY

One non-limiting and exemplary embodiment provides a transmitting apparatus and a transmission method for easily and correctly mixing an in-phase component and a quadrature-phase component in a quadrature modulator using a SCPA while maintaining high linearity and a wide variable output power range of the SCPA in which a local signal with a duty ratio of 25% or smaller is generated. without using frequency which is a multiple of frequency of the local signal. Additional benefits and advantages of the disclosed embodiments will be apparent from the specification and Figures. The benefits and/or advantages may be individually provided u the various embodiments and features of the specification and drawings disclosure, and need not all be provided in order to obtain one or more of the same.

In one general aspect, the techniques disclosed here feature a transmitting apparatus including a duty converter that makes a duty ratio, a time ratio of an on-period to one period of a carrier signal, 25% or less by adjusting a delay time, and a plurality of amplifiers that, are connected in parallel and that amplify the carrier signal with the duty ratio, each of the plurality of amplifiers including a P-channel element, an. N-channel element, and a capacitor connected to the P-channel element and the N-channel element, and being made in operation or in non-operation depending on a value of an input control signal, wherein when the amplifier among the plurality of amplifiers is made in non-operation, either one of the P-channel element and the N-channel element in the amplifier is turned off and the other one is turned on and off twice in a period of the carrier signal, and the plurality of amplifiers includes a plurality of first amplifiers to which an in-phase component of the carrier signal with the duty ratio is input, and a plurality of second amplifiers to which a quadrature-phase component the carrier signal with the duty ratio is input. These general and specific aspects may be implemented using a system, a method, and a computer program, and any combination of systems, methods, and computer programs.

DETAILED DESCRIPTION

Embodiments of the present disclosure are described in detail below with reference to drawings.
First Embodiment.

Figure 5:
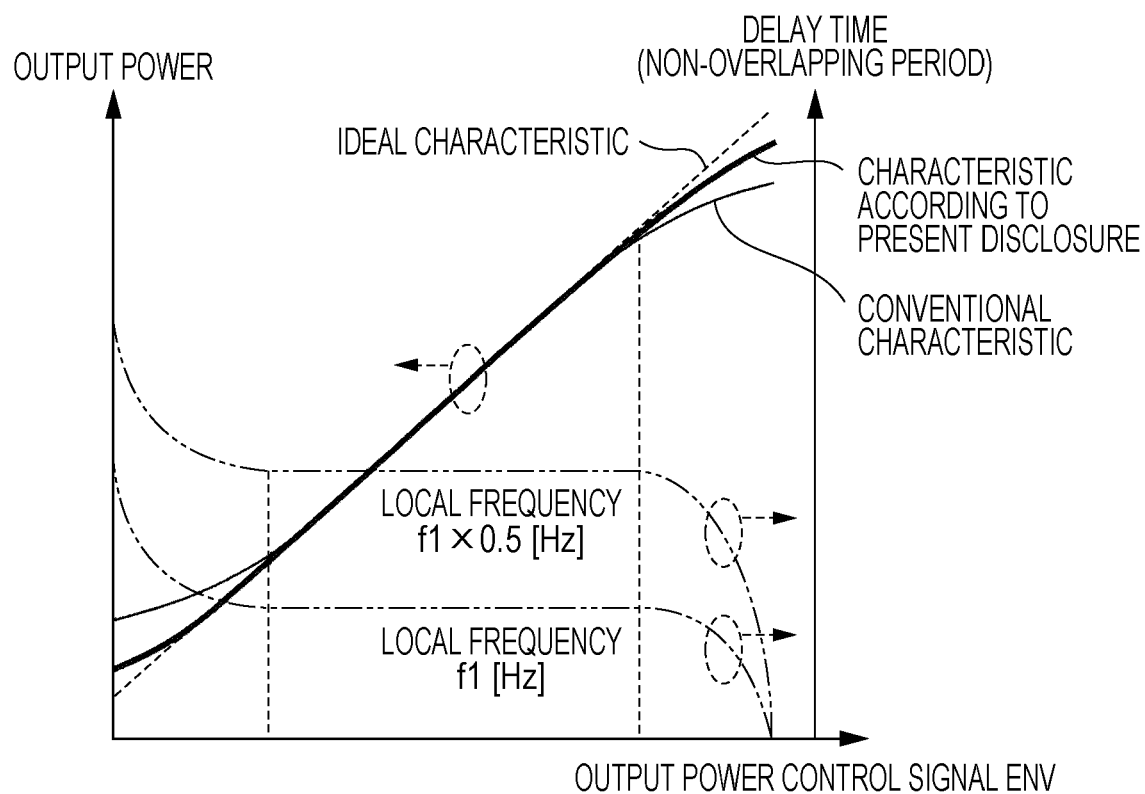
FIG. 5 is a diagram illustrating an input-output characteristic for a polar modulation transmission apparatus illustrated in FIG. 1 and a conventional amplifier.

In the case of the amplifier described in "A Switched-Capacitor RE Power Amplifier", 2011 IEEE JOURNAL OF SOLID-STATE CIRCUITS, VOL. 46, NO. 12, DECEMBER, the input-output characteristic thereof has non-linearity in a range close to saturation output power as illustrated in FIG. 5. A main, reason for this is a reduction in the power supply voltage of the class-D amplifier. The class-A amplifier is usually modeled as a constant current source. Thus, the output power of the class-amplifier is not easily influenced by the power supply voltage.

On the other hand, the class-D amplifier is modelled as a voltage source. In this model, the output voltage value of the voltage source is equal to the power supply voltage of the class-D amplifier. In a case where the class-D amplifier is implemented in a semiconductor LSI or the like, a voltage drop due to interconnection resistance or the like inside due LSI is very great in a range close to saturation output power in which an increase in current consumption occurs, which results in a reduction in the power supply voltage of the class-D amplifier. This causes the input-output characteristic to be nonlinear in a range close to saturation output power.

Furthermore, the non-overlapping clock technique, which is used to handle the shoot-through current, may cause the output power to decrease over the entire output power range. As described above, the non-overlapping clock, technique is very effective to handle the shoot-through current.

However, as described in "High-Efficiency Switched-Mode RF Power Amplifier", 1999 IEEE, the effect of the non-overlapping clock technique is equivalent to that obtained, by reducing the duty ratio of the on-state, and the non-overlapping clock technique causes a reduction in the output power of the amplifier. In the case of the class-D amplifier with a CMOS output stage, the output voltage amplitude thereof is limited by the power supply voltage, and therefore, to compensate for the reduction in the output power, there is no other choice than to reduce a load resistor thereby increasing a value of a current flowing through a load. To increase the current flowing through the load resistor, it is needed to increase the transistor size. However, in practical implementation using semiconductor devices, the large transistor tends to easily have a parasitic element such as parasitic capacitance, which results in an increase in power loss. Thus, a reduction in the power efficiency of the amplifier occurs.

Figure 3:
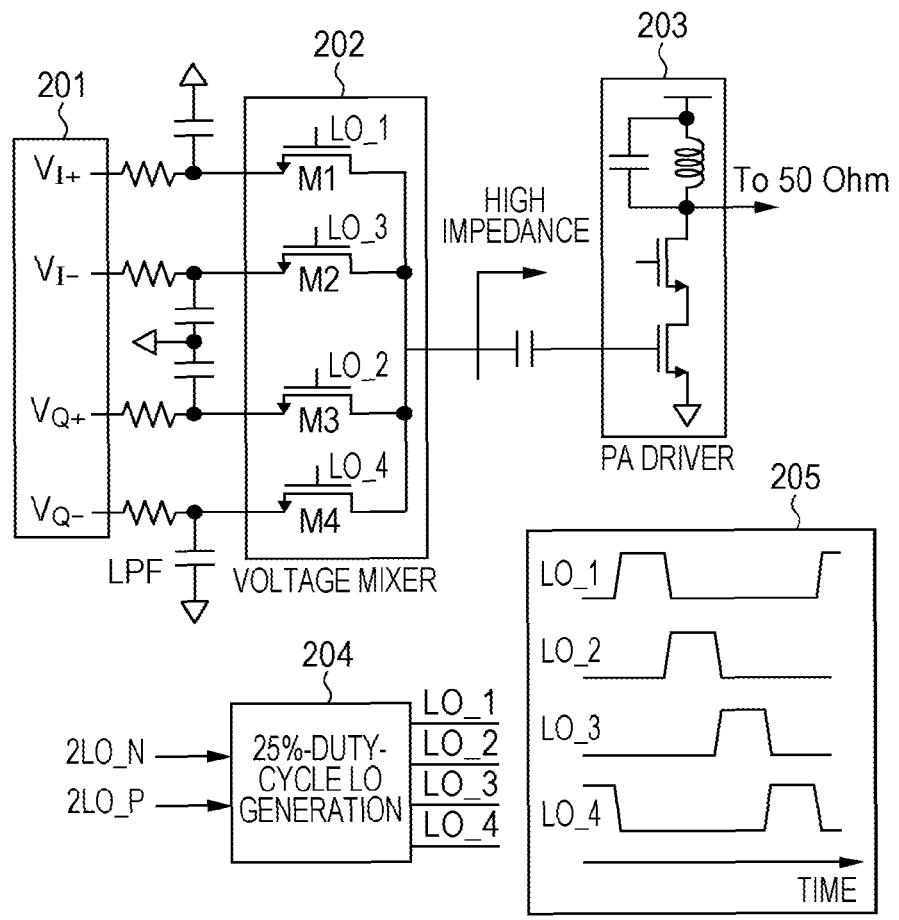
FIG. 3 is a diagram illustrating a configuration of a quadrature modulator described in "A 45 nm Low-Power SAW-less WCDMA Transmit Modulator Using Direct Quadrature Voltage Modulation" 2009 ISSCC.

In the configuration, of the quadrature modulator disclosed in "A 45 nm Low-Power SAW-loss WCDMA Transmit Modulator Using Direct. Quadrature Voltage Modulation", 2009 ISSCC illustrated in FIG. 3, in addition to the local signal, a signal with a frequency equal to a multiple of the frequency of the local signal is necessary, and thus the local signal generator needs a slightly larger consumption current compared with a case in which a conventional 50% duty ratio is produced. Furthermore, although it is assumed that the PA driver input has high impedance, it is difficult to achieve ideally high impedance at the PA driver in the practical circuit, and thus a charging/discharging current can flow into/from the PA driver input via switched (M1 to M4). As a result an analog IQ signal input to the quadrature modulator is influenced by the nonlinearity of the on-resistance of the switches (M1 to M4). Furthermore, as for a power amplifier at the following stage, it is necessary no use an analog power amplifier of a class A or AB, which is low in power efficiency. This makes it difficult to improve the power efficiency of the transmitting apparatus as a whole.

In the first embodiment of the present disclosure, the situation described above is handled as described below.

Figure 1:
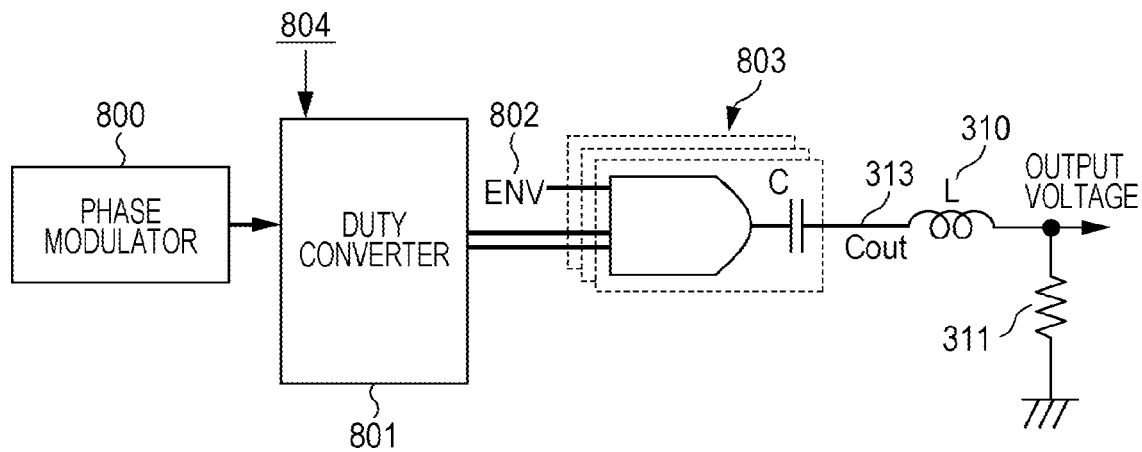
FIG. 1 is a diagram illustrating a configuration of a polar modulation transmission apparatus according to a first embodiment of the present disclosure.
Figure 2:
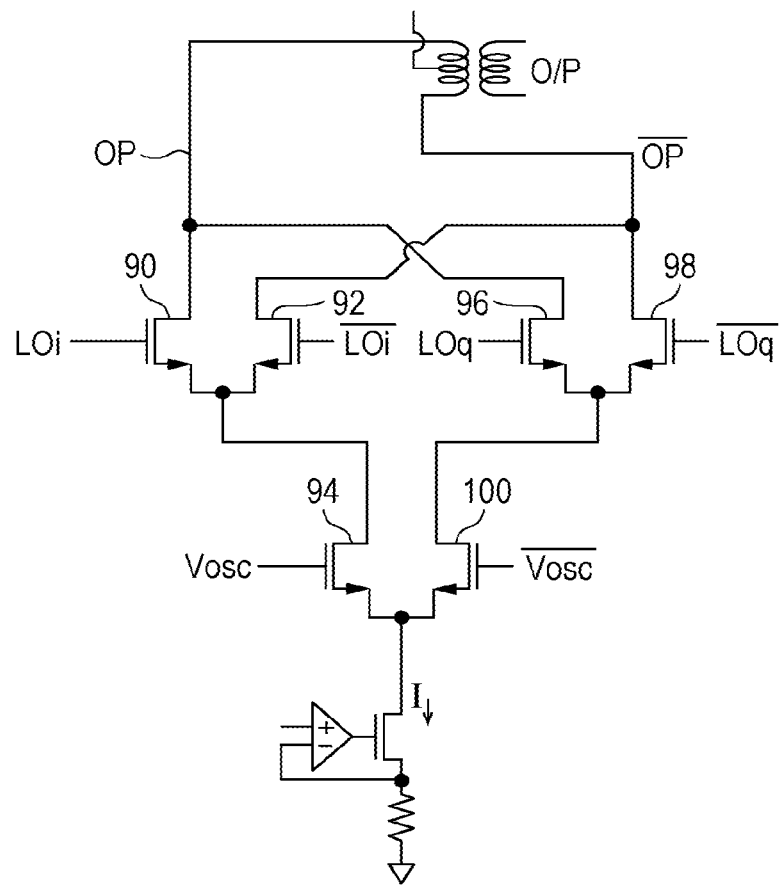
FIG. 2 is a diagram illustrating a configuration transmitting apparatus described in U.S. Pat. No. 7,750,749.

FIG. 1 is a diagram illustrating a configuration of a polar modulation transmission apparatus according to the first embodiment of the present disclosure. An amplitude component and a phase component obtained by converting the IQ signal into a polar coordinate system are used as an output power control signal ENV 802 input to the amplifier 803 and an output signal of a phase modulator 800.

Figure 6:
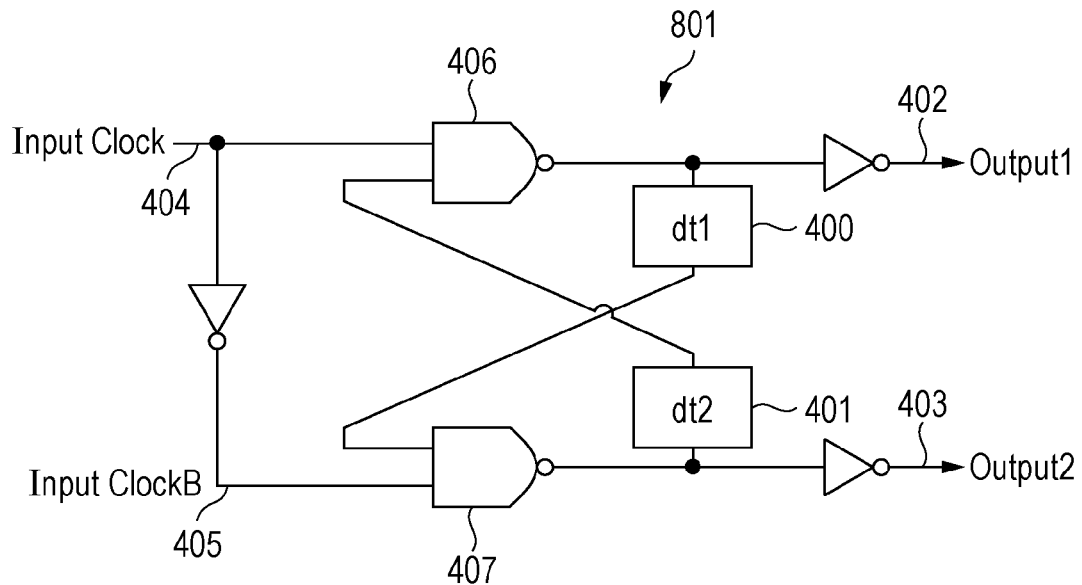
FIG. 6 is a diagram illustrating an internal configuration of a duty converter illustrated in FIG. 1.
Figure 7:
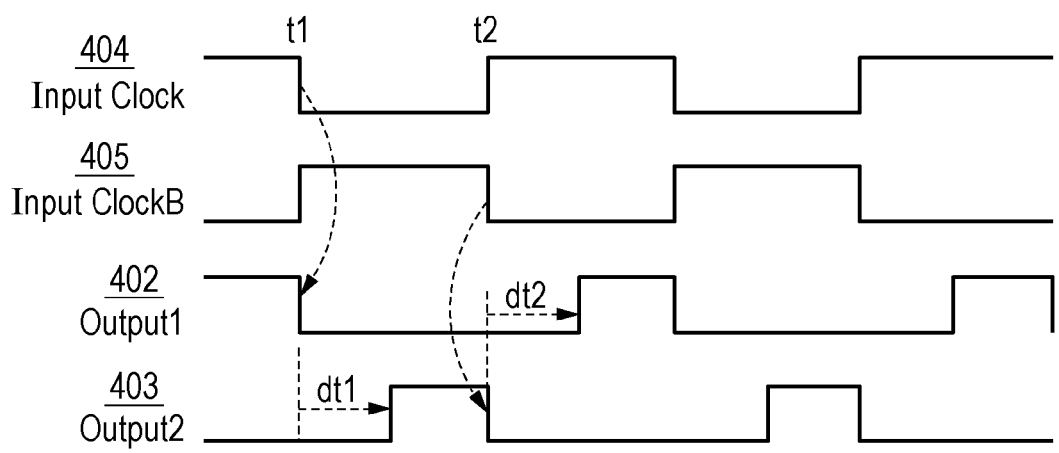
FIG. 7 is a diagram illustrating operation timings associated with the duty converter illustrated in FIG. 1.

First, referring to FIG. 6 and FIG. 6 and FIG. 7, a duty converter 801 is described. The duty converter 801 is often called a non-overlapping clock generator. A 50%-duty local signal (carrier signal) input to the duty converter 801 is transferred to a node Input. Clock 404 illustrated in FIG. 6.

A signal Input ClockB 405 is an inverting signal of the signal Input Clock 404. The signal Input Clock 404 and the signal Input ClockE 405 are both transferred to a node Output1 402 and a node Output2 403, respectively, via a NAND gate and an inverter. A signal output from each NAND gate is input via a delay element 400 or a delay element 401 to the other one of NAND gates, and thus the signal Output1 402 and the signal Output2 403 have time-domain waveforms as illustrated in FIG. 7.

In FIG. 7, for simplicity, it is assumed that elements other than the delay element 400 and delay element 401 have very small delays compared with delay times dt1 and dt2 of the respective delay element 400 and delay element 401, and they are neglected. Furthermore, it is assume that the delay times dt1 and dt2 are equal to each other.

When the signal Input Clock 404 changes to a low (hereinafter referred to as L) level at time t1, the output of the NAND gate 406 changes to a high (hereinafter referred to as H) level and thus when this signal appears as the signal Output1 402 after passing through the inverter, the signal Output1 402 changes to the L level. In this situation, the output of the NAND gate 406 is at the H level and the signal Input ClockB 405 is at the H level, the signal Output2 403 should be at the H level. However, it takes a time equal to the delay time dt1 of the delay element 400 for the output of the NAND gate 406 to reach the NAND gate 407, and thus the signal Output2 403 changes to the H level after a delay of the delay time dt1.

Subsequently, when the signal Input ClockB 405 changes to the L level at time t2, the output of the NAND gate 407 changes to the H level, and the signal Output2 403 changes to the L level. Although the signal Input Clock 404 at one of the inputs of the NAND gate 406 is at the H level, the signal at the other one of the inputs of the NAND gate 406 is given by the output of the delay element 401 which produces a delay of dt2, and thus the signal Output1 402 changes to the H level after he delay of dt2.

In this way, it is possible to produce the signal Output1 402 and the signal Output2 403 from the 50%-duty signal Input Clock 404 such that the H durations of the respective signals Output1 402 and Output2 403 are shortened by the delay times dt1 and dt2. That is, the on-period relative to the one period is changed while maintaining the frequency, which means that a duty conversion is achieved. Note that in FIG. 4, a signal. LO_Nch Gate 328 is given by the signal Output2 403 in FIG. 6, and a signal LO_Pch Gate 327 is given by the signal Output1 402 in FIG. 6.

Next, the amplifier 803 in FIG. 1 is described. Two signals are input to the amplifier 803 as follow. The duty ratio of a phase modulation signal is converted by the duty converter 801 and a resultant signal is given as one of inputs to the amplifier 803. The other signal is an output power control signal ENV 802 having a digital value. The amplifier 803 includes a plurality of class-D unit amplifiers that are connected in parallel, and as many class -D unit amplifiers as proportional to the values of the output power control signal ENV 802 operate.

Figure 4:
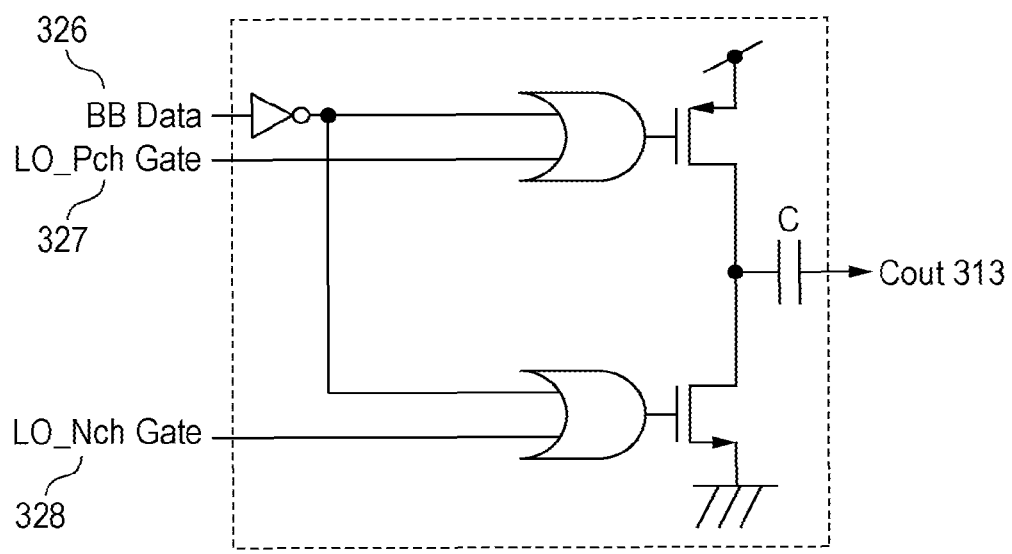
FIG. 4 is a diagram illustrating a configuration of a D-class unit amplifier illustrated FIG. 1.

FIG. 4 is a diagram illustrating a configuration of the D-class unit amplifier in FIG. 1. Inputs of the signal LO_Pch Gate 32 and the signal LO_Nch Gate 328 are on by phase modulation signals with a duty ratio converted by the duty converter 801. An input of a signal BB Data 326 of the C-class unit amplifier in FIG. 4 is given by an H-level signal (which causes the D-class unit am-amplifier to turn on or be in operation) or an L-level signal (which causes the D-class unit amplifier to turn off or in non-operation) according to the value of the output power control signal ENV 802. An output stage of the class-D unit amplifier is configured using a CMOS structure including a P-channel element (Pch) and an N-channel element (Nch) such that the signal is output to a node Cout 313 via a series capacitor C.

Next, a characteristic of the polar modulation transmission apparatus illustrated in FIG. 1 is described below with reference to FIG. 5. In FIG. 5, a horizontal axis represents the value of output power control signal ENV 802. A vertical axis on the left-hand side represents output power of the polar modulation transmission apparatus, and a vertical axis on the right-hand side represents delay times dt1 and dt2 of the delay element 400 and delay element 401 illustrated in FIG. 6.

As described above, when the delay times dt1 and dt2 are reduced, the non-overlapping period is reduced as may be seen from FIG. 7. As a result, the on-state duty ratio increases, which results in an increase in the output power of the polar modulation transmission apparatus. In the amplifier 803, the non-overlapping period is adjusted depending on the value of the output power control signal ENV 802. More specifically, to provide a high output power, the non-overlapping period is adjusted to be zero. On the other hand, to provide an average output power, the non-overlapping period is adjusted to a proper value. To provide a lower output power, the non-overlapping period is adjusted to be large.

By controlling the non-overlapping period in the above-described manner, it is possible to achieve a small non overlapping period in a range close to the saturation output power compared with that according to the conventional technique, and thus it is possible to achieve a large on-state duty ratio compared with that according to the conventional technique. Therefore, it is possible to achieve a sufficiently high saturation output power. Thus, it is possible to improve the nonlinearity without using large transistors which would result in a reduction in power efficiency regardless of the value of output power.

In the range around the average output power, by setting the non-overlapping period to a proper value, it is possible to prevent an unnecessary increase in consumption current due to a shoot-through current, and thus it is possible to prevent a reduction in power efficiency. As a result, it is possible to achieve both the sufficiently high saturation output power and the high power efficiency in the operation with the average output power. Note that in the case of a modulation signal (for example, an orthogonal frequency division multiplex (OFDN) signal), the envelope of the output signal from the amplifier 803 varies, and the frequency of occurrence of the average output power is sufficiently higher than the frequency of occurrence of the high output power and that of the low output power. Therefore, even though a shoot-through current occurs as a result of making the setting such that there is no non-overlapping period atone saturation output power, a significant reduction does not occur in the power efficiency in the operation with the average output power.

In the state in which the output power is low, the non-overlapping period is set to be large. In the case of the amplifier disclosed in "A. Switched-Capacitor RF Power Amplifier", 2011 IEEE JOURNAL OF SOLID-STATE CIRCUITS, VOL. 46, NO. 12, DECEMBER, the output power is controlled using the technique in which the capacitance ratio is adjusted. However, in practice, as can be seen from the conventional characteristic in FIG. 5, there is a region in which the output power does not decrease linearly even when the output power control signal ENV 802 is reduced. A cause for this is that because of the bad input-output isolation of the D-class unit amplifier illustrated in FIG. 4, the signals to the node LO_Pch Gate 327 and the node LO_Nch Gate 328 are directly leaked to the node Gout 313 even when the signal BB Data 326 is at the H level. To handle this situation, when the non-overlapping period is increased, then the resultant effect is similar to that obtained when the on-state duty of the signal is reduced as described in "High-Efficiency Switched-Mode RF Power Amplifier", 1999 IEEE, and thus it becomes possible to control the output power to a further lower level. As a result, the expansion of the variable output power range is achieved.

In FIG. 5, the delay times are also shown for the local frequency of f1 (Hz) as well as for the local frequency which is one-half of f1. To achieve the constant duty ratio for different values of the local frequency, the delay time needs to be varied in proportion to the frequency of the local frequency.

According to the first embodiment, as described above, the non-overlapping period is controlled such that when the output power is high, the non-overlapping period is set to be zero, the non-overlapping period is set to a proper value when the operation is with the average output power, and the non overlapping period is increased when the output power is low. By using the non-overlapping clock technique to handle the shoot-through current, it becomes possible to prevent a reduction in power efficiency and achieve an expansion of a variable output power range and a sufficiently large output power without using large transistors.

In the example described above, the non-overlapping period is varied discretely depending on the output power in this case, the AM-AM characteristic and the AM-PM characteristic of the amplifier change discretely. This can cause the distortion characteristic of the amplifier to be degraded. To handle this situation, the steps of discretely changing the non-overlapping period may be reduced such that the non-overlapping period is changed gradually.

Second Embodiment

Figure 8:
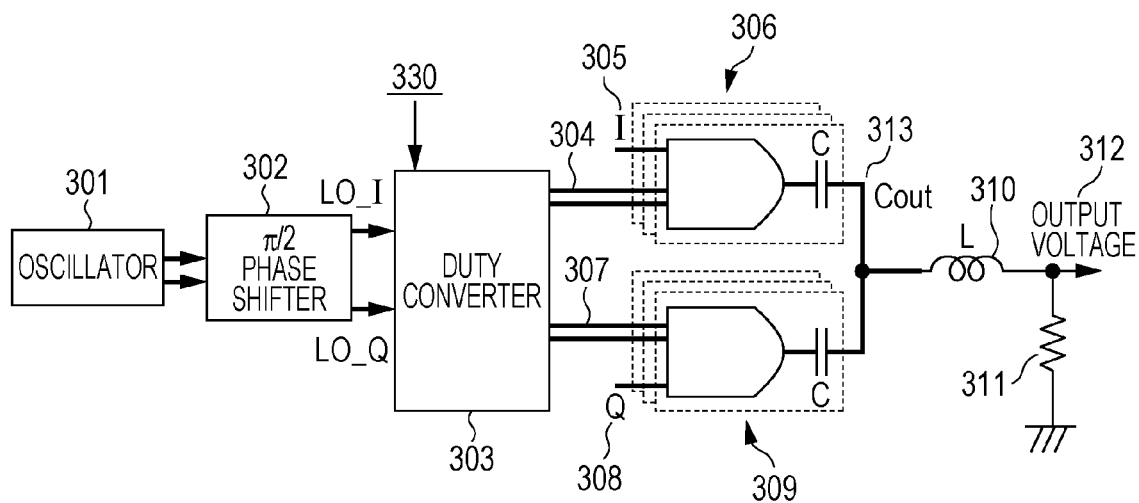
FIG. 8 is a diagram illustrating an overall, configuration of a quadrature modulator according to a second embodiment of the present disclosure.

FIG. 8 is a diagram illustrating an overall configuration of a quadrature modulator according to a second embodiment of the present disclosure. From a differential signal input from an oscillator 301, a π/2-phase shifter 302 generates a local signals (carrier signals) LO_I and LO_Q which are different by 90° in phase.

The duty ratio of the local signals LO_I and LO_Q is converted by the duty converter 303 from a duty ratio of 50% to a duty ratio of 25% or less.

In the π/2-phase shifter 302, there are inverting signals of the respective local signals LO_I and LO_Q, which are output signals. When the values of digital baseband signals (control signals) I305 and Q308 are negative, the inverting signals are output. A reason for this is to represent signals using all four quadrants in the IQ plane. When the signals I305 and Q308 are negative and the quadrature modulator output. Cout 313 is represented using equation (1) as described below, the result is equivalent to adding π to the phase θ of the local signal. Note that this is achieved because the inverting signals of the local signals are used.

$$\text{Quadrature modulator output } Cout\ 313 = \quad (1)$$
$$(-I) \times \cos\theta + (-Q) \times \sin\theta = I \times \cos(\theta + \pi) + Q \times \sin(\theta + \pi)$$

Note that in the duty converter 303, the duty converters 801 described above are used for processing I and Q signals. The function and the operation timings of the duty converter 303 are similar to those described above with reference to FIG. 6 and FIG. 7, and thus a further description is omitted herein.

As with the first embodiment described above with reference to FIG. 5, also in the second embodiment, the delay times dt1 and dt2 of the respective delay element 400 and delay element 401 in the duty converter 303 are adjusted, depending on the output power and the frequency thereby achieving both the sufficiently high saturation output power and the improved power efficiency in the state in which the output power is at the average level. In the second embodiment, the horizontal axis of FIG. 5 can be regarded as representing the digital baseband signals I305 and Q308 of the I and Q signals.

The delay times dt1 and dt2 of the respective delay element 400 and delay element 401 in the duty converters 303 for the I and Q signals are adjusted depending on the output power of the I-amplifier 306 and the output power of the Q-amplifier 309. Alternatively, the delay times dt1 and dt2 of the delay element 400 and the delay element 401 in the duty converters 303 for I and Q components may be adjusted according to a greater one of the I and Q digital baseband signals I305 and Q308. This is allowed because the larger one of the I and Q digital baseband signals I305 and Q308 has a larger and dominant influence on the output power.

Next, a frequency converter is described below with reference to FIG. 8. An I-amplifier 306 and a Q-amplifier 309 respectively functioning as frequency converters for I and Q components. The I-amplifier 306 receives two input signals one of which is the digital baseband signal I305 and the other is a signal 304 obtained by converting the duty ratio of the local signal LO_I. The Q-amplifier 309 receives two input signals one of which is the digital baseband signal Q305 and the other is a signal 307 obtained by converting the duty ratio of the local signal LO_Q. Each of the I-amplifier 306 and Q-amplifier 309 includes a plurality of class-D unit amplifiers connected in parallel configured such that as many class-D unit amplifiers as proportional to the values of the digital baseband signal I305 or Q308 operate. Each of the I-amplifier 306 and the Q-amplifier 309 is similar to the above-described amplifier 803 in FIG. 1, and thus a further description thereof is omitted.

Figure 9:
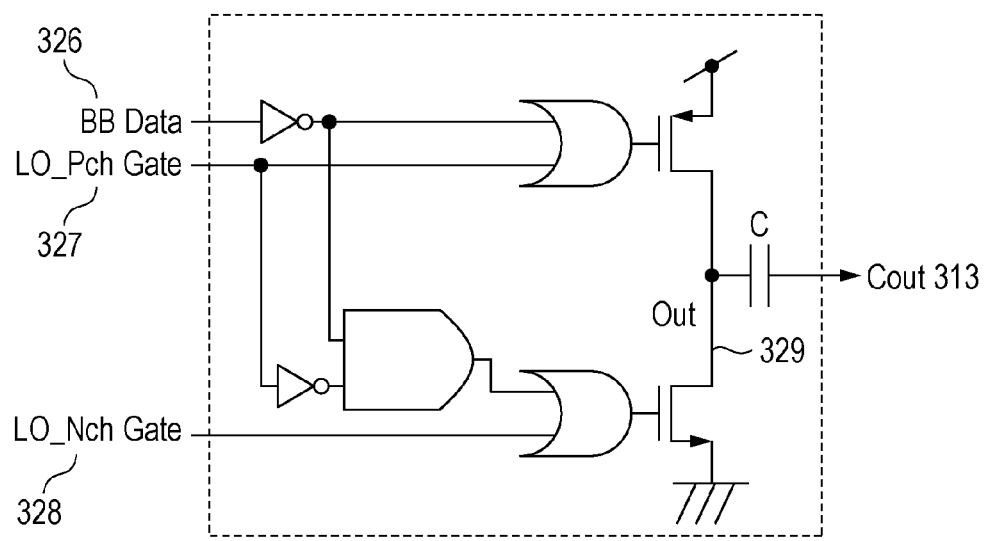
FIG. 9 is a diagram illustrating an internal configuration of a D-class unit amplifier illustrated in FIG. 8.

FIG. 9 illustrates a D-class unit amplifier in FIG. 8. As for a signal LO_Pch Gate 327 (corresponding to the signal 304 or 307) and a signal LO_Nch Gate 328 (corresponding to the signal 304 or 307), LO signals each having a duty ratio adjusted to be 25% or less are input. As for a signal BB Data 326, an H-level signal (the D-class unit amplifier is turned, on or in operation) or an L-level signal (the D-class unit amplifier is turned off or in non-operation) is input depending on the value of the digital baseband signals I305 and Q308. An output stage of the class-D unit amplifier is configured using a CMOS structure including a P-channel element (Pch) and an N-channel element (Nob) such that the signal is output to a node Cout 313 via a series capacitor C.

The π/2-phase shifter 302 may be realized in various manners. For example, as with a polyphase filter disclosed in "L-band SiGe-MMIC Vector Synthesis Type Analog Phase Shifter Using Polyphase Filter", 2002 IEICE technical report, passive elements which consume no current may be used thereby achieving a low consumption current.

Figure 10:
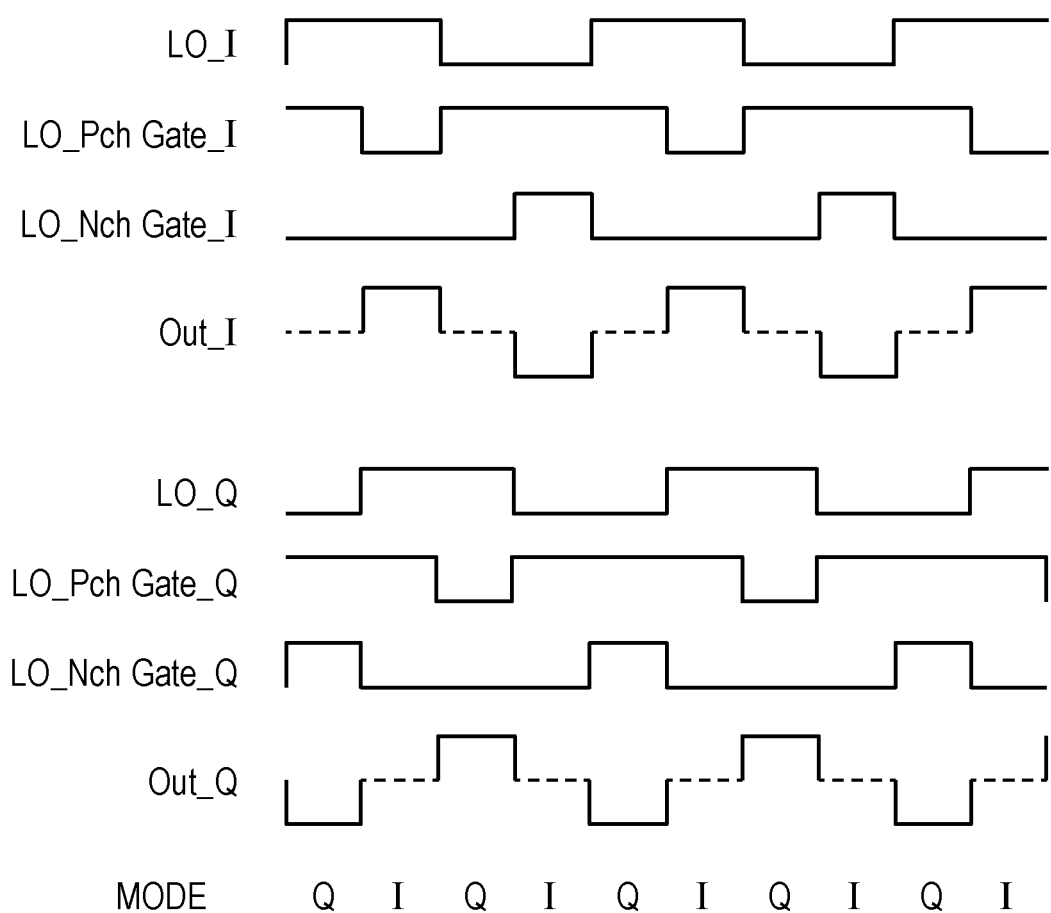
FIG. 10 is a diagram illustrating operation timings for a case where a signal PB Data illustrated in FIG. 9 is at an H level.

FIG. 10 illustrates operation timings associated with the D-class unit amplifier in a state in which the signal BB Data 326 is at the H level (the D-class unit amplifier is turned on or in operation). LO_I and LO_Q denote signals input to the duty converter 303.

The LO_I and LO_Q signals have the same frequency but there is a phase difference of 90° between them, which causes waveforms of the LO_Pch. Gate signal, the LO_Nch Gate signal, and the Out signal to shift in time by an amount corresponding to one quarter of the period of the LO signals.

The signals LO_Pch Gate_I and LO_Nch Gate_I have a duty ratio of 25% converted from the 50% duty ratio of the signal LO_I according to the procedure described above with reference to FIG. 7 The inversion of the signal Output1 402 in FIG. 7 corresponds to the signal LO_Pch Gate_I, and the inversion of the signal Output2 403 in FIG. 7 corresponds to the signal LO_Nch Gate_1.

Out_I represents a waveform that will he obtained when the output of the I-amplifier 306 and the output of the amplifier 309 are not connected. In this waveform, broken-line parts each denote a high-impedance state (hereinafter, referred to as "Hi-z"). The impedance of Out_I is at Hi-z in periods other than periods in which LO_Pch. Gate_I is at L or LO_Nch Gate_I is at H, and Out_I has a periodic pattern of H, Hi-z, L, and Hi-z. Similarly, the signal Out_Q, which is a signal output from the Q class-D unit amplifier, also has a periodic pattern of H, Hi-z, L, and Hi-z. However, there is a shift in time between the phases of Out_I and Out_Q by an amount corresponding to one quarter of the period of the LO signal, and thus when one of the signals Out_I and Out_Q is at H or L, the other one is always at Hi-z.

Mode in FIG. 10 represents a manner in which, as a result of the operation described above, the I signal or the Q signal appears at the Gout node 313 in FIG. 8. This makes it possible to connect the outputs of I-amplifier 306 and the Q-amplifier 309 to each other without causing interference to occur between them.

Figure 11:
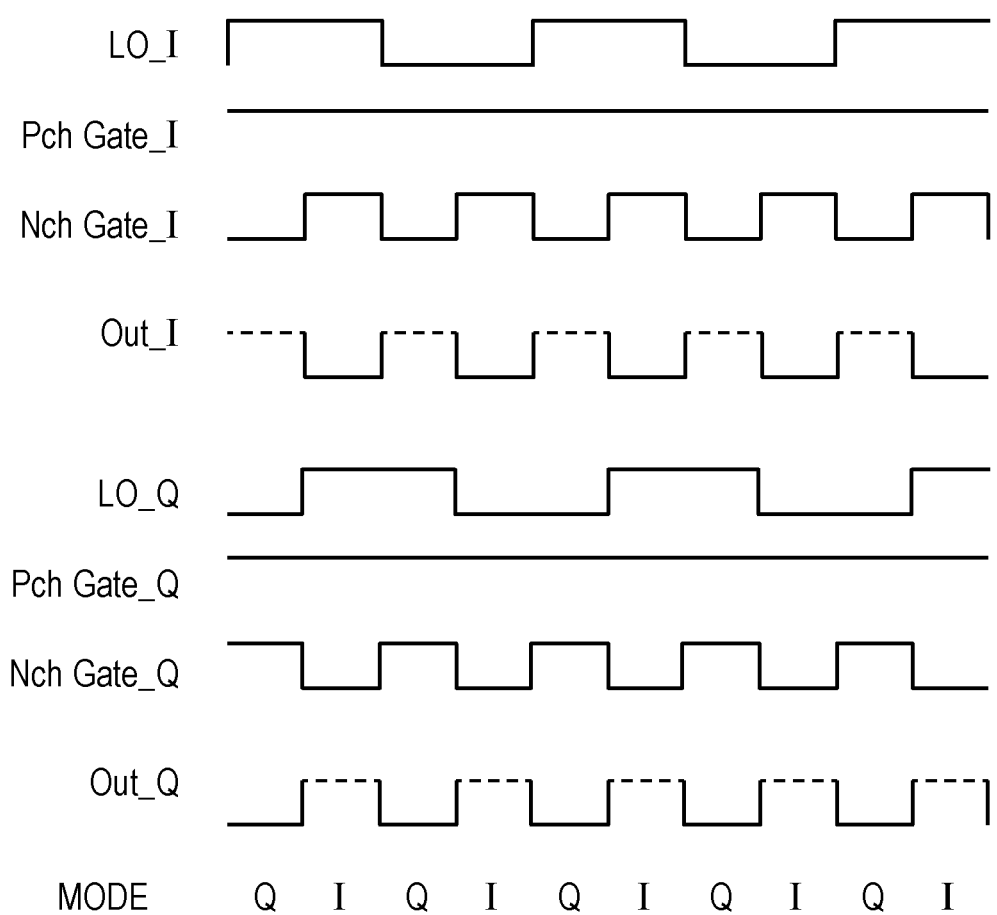
FIG. 11 is a diagram illustrating operation timings for a case where a signal PB Data illustrated in FIG. 9 is at an L level.

FIG. 11 illustrates operation timings associated with the C-class unit amplifier in a state in which the signal BB Data 326 is at the C level (the D-class unit amplifier is turned off or in non-operation). The following description will focus on a difference from the operation timings when the signal BB Data 326 is at the H level.

The signal Pch Gate_I (input to the P-channel element) is always at the H level, and thus the Pch MOS transistor (the output of the P-channel element) in the CMOS output stage in FIG. 9 is always in the off state. The signal Nch Gate_I (input to the N-channel element) alternately changes its level between L and H, and thus the Nch MOS transistor (the output of the N-channel element) turns on and off twice in each period of the local signal (carrier signal) LO_I. Thus, the signal Out_I has a periodic pattern of L and Hi-z.

However, as in the case in which the signal BB Data 326 is at the H level, there is a shift in time between the phases of Out_I and Out_O by an amount corresponding to one quarter of the period of the signal LO, and thus when one of the signals Out_I and Out_Q is at the L level, the other one is always at Hi-z. Mode in FIG. 11 represents a manner in which, as a result of the operation described above, the I signal or the Q signal appears at the node Cout 313 in FIG. 8.

Figure 12:
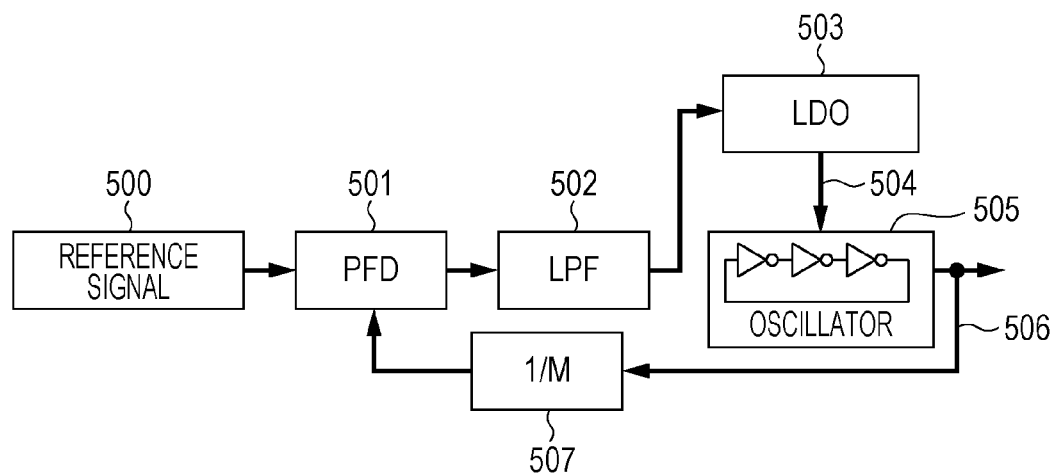
FIG. 12 is a diagram illustrating a configuration of a phase-locked loop (PLL) used in correcting a delay according to a second embodiment of the present disclosure.

Next, a method of reducing unevenness in the delay times dt1 and dt2 of the delay element 400 and the delay element 401 in the duty converter 303 is described below with reference to FIG. 12. FIG. 12 illustrates a configuration of a phase locked loop (PLL) configured such that an oscillator 505 output a signal with a frequency equal to a product of a constant frequency of a reference signal 500 and a frequency division ratio M of a frequency divider 507. Note that the oscillator 505 is a ring oscillator using elements having the same shape as the shapes of the delay element 400 and the delay element 401. In the present embodiment, a power supply voltage (oscillation frequency) 504 is output from a low drop out (LOO) unit 503 operating as a variable power supply and is applied as an adjustment signal to the oscillator 505. By varying the adjustment signal, the internal delay time of the oscillator 505 is varied thereby controlling the frequency of the oscillator 505.

In this configuration, even when there is a variation among apparatuses or even when a change in temperature occurs, the frequency of the PLL is maintained at a constant value, and thus the internal, delay time of the oscillator 505 is maintained at a constant value. Thus, by applying the same power supply voltage (oscillation frequency) as that applied to the oscillator 505 from the LDO 503 to the delay element 400 and the delay element 401 illustrated in FIG. 6, it is possible to control the delay times of these delay elements 400 and 401 to be substantially constant. In the configuration illustrated in FIG. 12, the oscillator 505 is formed using a three-stage inverter, and thus the delay time per one stage is one third of the period of the oscillation frequency.

Note that the frequency division ratio M of the frequency divider 507 is not limited to integer values, but the frequency division ratio M may include a decimal. In the case where the frequency division ratio M includes the decimal, it becomes possible to control the oscillation frequency more precisely, and thus it becomes possible to adjust the delay time more precisely.

Figure 13:
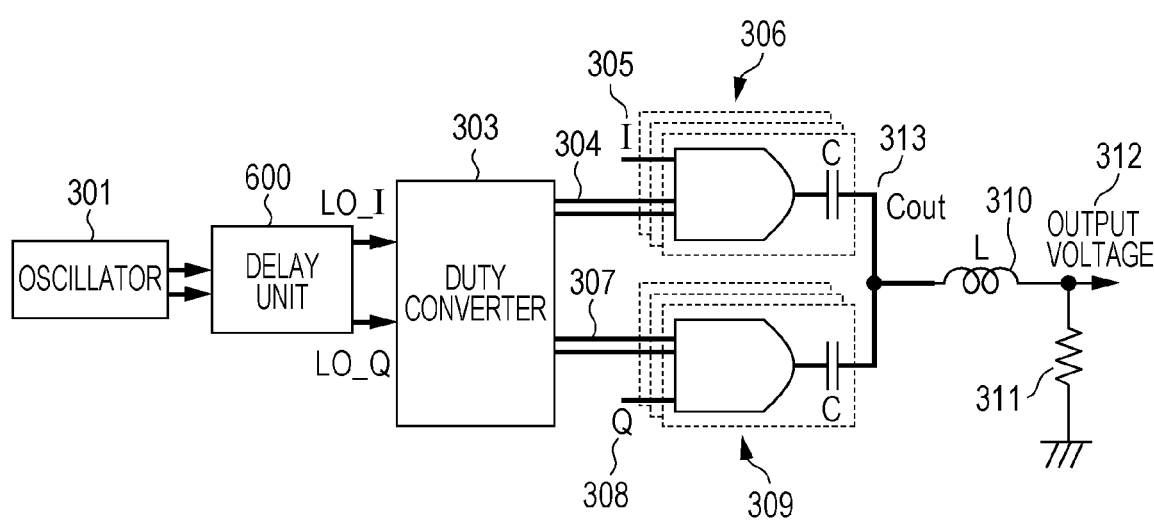
FIG. 13 is a diagram illustrating an overall configuration of a quadrature modulator including a IQ quadrature error correction unit.

Next, a method of correcting a quadrature error is described below with reference to FIG. 13 and FIG. 14. The quadrature error includes two errors, that is, an amplitude error which is a difference between the amplitude of the I component and the amplitude of the Q component, and a phase error which is a deviation of the phase difference between I and Q from an ideal value of 90°.

The quadrature modulator is formed on a semiconductor integrated circuit. To minimize the quadrature error, the layout is designed such that as high symmetry as possible is achieved between I and Q. However, an error between I and Q may occur due to various factors such as various limitation, production variations, and the like.

The quadrature error can occur in various signal processing units (functional blocks). In the example illustrated in FIG. 14, the phase difference between the local signals LO_I and LO_Q, which are input signals to the duty converter 303, is equal to an ideal value, that is 90°. However, with respect to the signals LO_Pch Gate_I and LO_Nch Gate_I, which are the output signals from the duty converter 303, another set of output signals LO_Pch Gate_Q and LO_Nch Gate_Q are output earlier in time by dT. That is, it is assumed in this example that there is a difference in terms of the propagation delay between the input and output signals of the duty converter 303 between I and Q.

Figure 14:
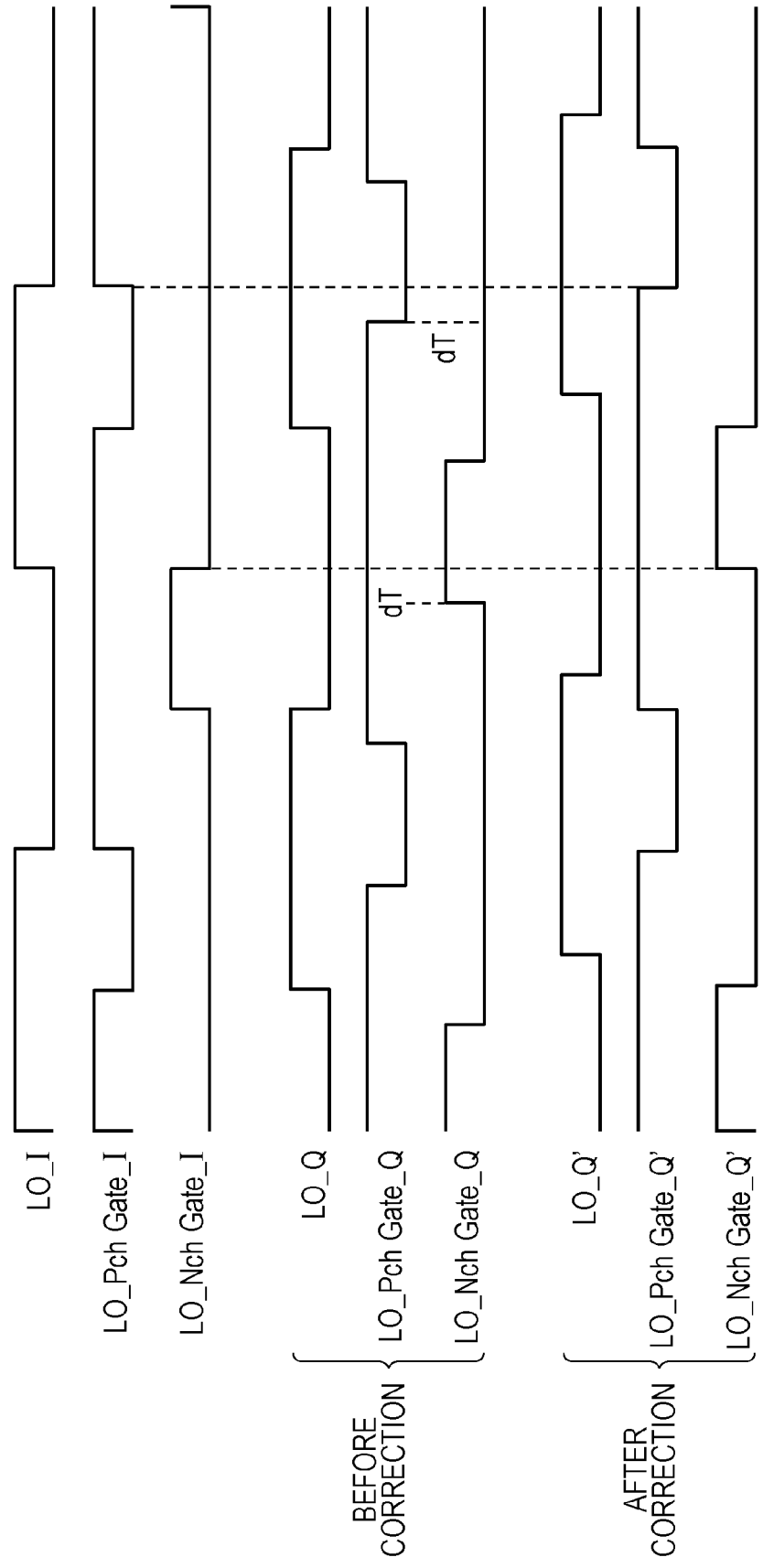
FIG. 14 is a diagram illustrating operation timings associated with a quadrature modulator illustrated in FIG. 13.

To correct such a phase error, the delay element 600 includes variable delay elements separately provided for LO_I and LO_Q By increasing the delay time by d1 for Q using one of the internal variable delay elements in the delay element 600, it is possible to correct the delays as LO_Pch Gate_Q' and LO_Nch Gate_Q' in FIG. 14 are corrected.

According to a method of adjusting the phase error, a sine wave and a cosine wave with an angular velocity ω [rad/sec] are input as the digital baseband signals I305 and Q308 to the respective amplifier 306 and amplifier 309, and the phase difference between I and Q is adjusted such that the time fluctuation of the envelope of the output voltage 312 applied to a load 311 is minimized. According to another method, the phase difference between I and Q is adjusted so as to minimize, in the output volt age 312 applied to the load 311, a frequency component apart away by 2×π×ω, excluding specified frequencies, from the carrier frequency another method is to provide a means such as that illustrated in FIG. 12 to reduce delay time variation. This also provides improved resistance against, unevenness. For example, the variable delay element provided in the delay element 600 may be used so as to also function as π/2-phase shifter similar to the π/2-phase shifter 302.

In a case where there is an amplitude error between I and Q, as with ;he above described method of adjusting the phase error, it is possible to eliminate the amplitude error between I and Q by adjusting the duty ratio of the output signals 304 and 307 from the two duty converters for I and Q in the duty converter 303.

According to the second embodiment, as described above, a quadrature modulator is formed using two amplifiers (SCPA) for processing I and Q, and the load 311 is directly driven thereby, instead of using a class-A or class-B analog power amplifier with a low power efficiency.

Furthermore, without having to provide switches in series to the outputs of the I amplifier and the Q amplifier, a duty ratio of 25% or less is obtained for the local signal, and besides the class-D unit amplifiers are operated such that one of the I-amplifier and the Q-amplifier is connected to the output side in any state regardless of whether the output power control signal is at the on-level (BB Data 26=H) or the off-level (BB Data 326=L). Thus, it is possible to directly connect the outputs of the I and Q amplifiers without causing interference between them to occur while maintaining merits of the SCPA in terms of high linearity, a wide variable output power range, a constant output impedance, and the like.

Furthermore, in producing the 25% duty ratio, the local signal with the 50% duty ratio is converted so as to have duty ratio of 25% by the I and Q duty converters, without having to use a frequency multiple of the frequency of the local signal.

The duty converter uses the non-overlapping clock technique using time delays. Furthermore, the I and Q duty converters are each capable of converting to the duty ratio to an arbitrary value, and thus it is possible to easily adjust the output level and correct the quadrature error in terms of the amplitude and the phase between I and O.

Other Embodiments

Figure 15:
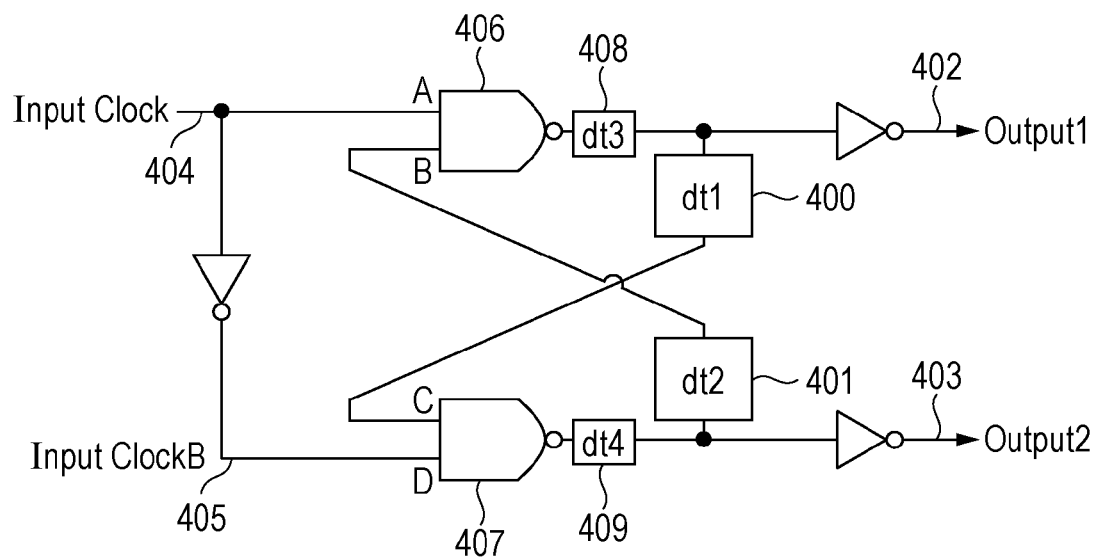
FIG. 15 is a diagram illustrating a configuration of a duty converter according to an embodiment.

FIG. 15 illustrates a configuration of a duty converter according to another embodiment. Referring to FIG. 15, a method of correcting a quadrature error is described, below.

The duty converter illustrated in FIG. 15 is different from the duty converter 801 illustrated in FIG. 6 in that a delay element 408 and a delay element 409 are additionally provided at locations following the NAND gate 406 and the NAND gate 407, respectively.

The delay element 408 and the delay element 409 respectively produce a delay time dt3 and a delay time dt4.

Figure 16:
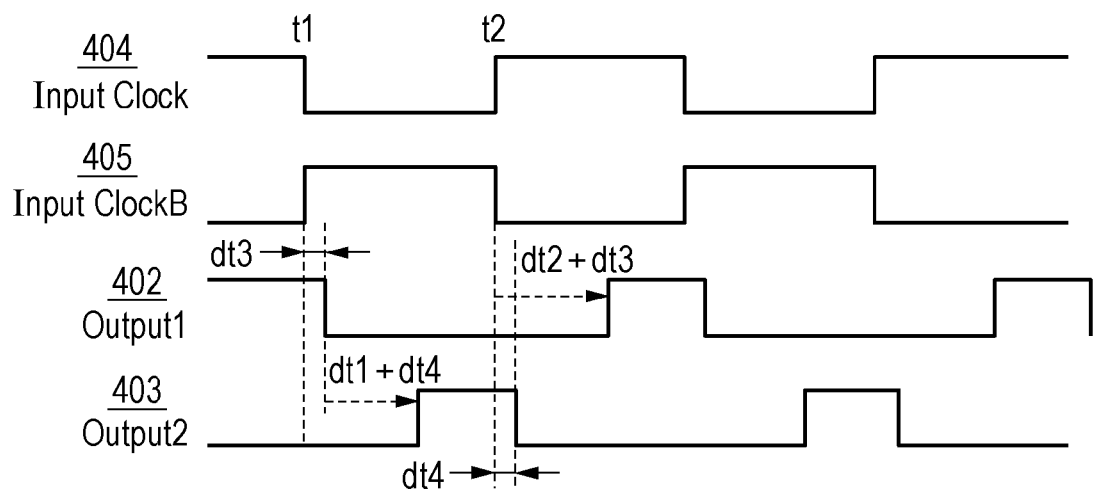
FIG. 16 is a diagram illustrating operation timings associated with the duty converter illustrated in FIG. 15.

With reference to FIG. 16, an operation of the duty converter illustrated in FIG. 15 is described below. The signal Output1 402 and the signal Output2 403 are at the H level during respective times TH1 and TH2, which are represented by mathematical expressions as fellows.

$$TH1=(T/2)-dt4-dt2$$

$$TH2=(T/2)-dt3-dt1$$

where T denotes a time of one period of the input signal. Input Clock 404.

In the adjustment of the phase error between I and Q, when it is assumed that dT3=d14 and d11=d12, then TH1 and TH2 can be rewritten as TH1=(T/2)−dt3−dt1 and TH2=(T/2)−dt3−dt1.

As can be seen from FIG. 16, dt3 (=d4) can cause both signals Output1 402 and Output2 403 to be delayed with reference to the signal Input Clock 404. In this situation, when dt1 is changed while maintaining the −dt3−dt1 constant, then the duty ratios of Output1 402 and Output2 403 are maintained unchanged during H periods. By adjusting dt3 (=dt4) between I and Q in the above-described manner, it is possible to adjust the phase difference between I and Q.

To adjust the amplitude error between I and Q, −dt3−dt1 between. I and Q may be adjusted. The method therefor is similar to that described above, and thus a further description thereof is omitted.

To adjusts the phase between. Output1 402 and Output2 403, d3 and d4 may be set to be different from each other. In this adjustment, when −dt4−dt2 and −dt3−dt1 are maintained constant, then the duty ratios of Output1 402 and Output2 403 are maintained unchanged. during H periods.

The transmitting apparatus and the transmission method according to the present disclosure are applicable, for example, to a wireless communication terminal, a base station, and the like in a wireless communication system.

Cross Reference to Related Application

The present application claims the benefit of Japanese Patent Application No. 2013-267836 filed on Dec. 25, 2013. The entire disclosure of the above-identified application, including the specification, drawings and claims, is incorporated herein by reference in its entirety.

What is clamed is:

1. A transmitting apparatus comprising:
   a duty converter that makes a duty ratio, a time ratio of an on-period to one period of a carrier signal, 25% or less by adjusting a delay time; and
   a plurality of amplifiers that are connected in parallel and that amplify the carrier signal with the duty ratio, each of the plurality of amplifiers including a P-channel element, an N-channel element, and a capacitor connected to the P-channel element and the N-channel element, and being made in operation or in non-operation depending on a value of an input control signal,
   wherein when an amplifier among the plurality of amplifiers is made in non-operation, either one of the P-channel element and the N-channel element in the amplifier is turned off and the other one is turned on and or twice in a period of the carrier signal, and
   the plurality of amplifiers include a plurality of first amplifiers to which an in-phase component of the carrier signal with the duty ratio is input, and a plurality of second amplifiers to which a quadrature-phase component of the carrier signal with the duty ratio is input.

2. The transmitting apparatus according to claim 1, further comprising a phase locked loop (PLL) that outputs a constant frequency using an oscillator including an element equal in shape to an element configured to generate the delay time in the duty converter,
   wherein an adjustment signal to the oscillator is applied to the element configured to generate the delay time.

3. The transmitting apparatus according to claim 1, wherein the plurality of first amplifiers and the plurality of second amplifiers adjust the delay time according to output power and the frequency of the carrier signal respectively controlled by the control signal.

4. The transmitting apparatus according to claim 3, wherein the duty converter is configured such that when the delay time is adjusted, the duty converter discretely switches a non-overlapping period among two or more values.

5. The transmitting apparatus according to claim 3, wherein the duty converter adjusts the delay time according to a frequency of the carrier signal, so as to make the duty ratio constant regardless of the frequency of the carrier signal.

6. The transmitting apparatus according to claim 3, wherein the duty converter is configured such that the duty converter applies a sine wave and a cosine wave with an angular velocity ω (rad/sec) as the control signal to the plurality of first amplifiers and the plurality of second amplifiers, and the duty converter adjusts a phase difference between the in-phase component and the quadrature-phase component of the carrier signal so as to minimize a change in an envelope of a time-domain waveform of resultant combined output of the plurality of first amplifiers and the plurality of second amplifiers or so as to minimize a frequency component, excluding a specified frequency, apart away by 2×π×ω from the frequency of the carrier signal in the resultant combined output of the plurality of first amplifiers and the plurality of second amplifiers.

7. The transmitting apparatus according to claim 3, further comprising an element configured to adjust a phase difference between the in-phase component and the quadrature-phase component of the carrier signal, wherein the element is configured such that the duty converter applies a sine wave and a cosine wave with an angular velocity $\omega$ (rad/sec) as the control signal to the plurality of first amplifiers and the plurality of second amplifiers, and the element adjusts a phase difference between the in-phase component and the quadrature-phase component of the carrier signal so as to minimize a change in an envelope of a time-domain waveform of a resultant combined output of the plurality of first amplifiers and the plurality of second amplifiers or so as to minimize a frequency component, excluding a specified frequency, apart away by $2 \times \pi \times \omega$ from the frequency of the carrier signal in the resultant combined output of the plurality of first amplifiers and the plurality of second amplifiers.

8. A transmission method comprising:

making a duty ratio, a time ratio of an on-period to one period of a carrier signal, 25% or less by adjusting a delay time: and controlling a plurality of amplifiers, which are connected in parallel and amplify the carrier signal with the duty ratio, each of the plurality of amplifiers including a P-channel element, an N-channel element, and a capacitor connected to the P-channel element and the N-channel element, and being made in operation or in non-operation depending on a value of an input control signal, wherein when an amplifier among the plurality of amplifiers is made in non-operation, either one of the P-channel element and the N-channel element in the amplifier is turned off and the other one is turned on and off twice in a period of the carrier signal, and the plurality of amplifiers includes a plurality of first amplifiers to which an in-phase component of the carrier signal with the duty ratio is input, and a plurality of second amplifiers to which a quadrature-phase component of the carrier signal with the duty ratio is input.

* * * * *